United States Patent [19]
Guidash

[11] Patent Number: 6,107,655
[45] Date of Patent: Aug. 22, 2000

[54] ACTIVE PIXEL IMAGE SENSOR WITH SHARED AMPLIFIER READ-OUT

[75] Inventor: Robert M. Guidash, Rush, N.Y.

[73] Assignee: Eastman Kodak Company, Rochester, N.Y.

[21] Appl. No.: 08/911,235

[22] Filed: Aug. 15, 1997

[51] Int. Cl.[7] .................. H01L 27/148; H01L 29/768
[52] U.S. Cl. ........................... 257/233; 257/239
[58] Field of Search .................. 257/231, 232, 257/233, 239

[56] References Cited

U.S. PATENT DOCUMENTS

| | | | |
|---|---|---|---|
| 4,636,865 | 1/1987 | Imai | 358/213 |
| 5,237,190 | 8/1993 | Wu et al. | 257/234 |
| 5,243,180 | 9/1993 | Nam | 250/208.1 |
| 5,280,186 | 1/1994 | Lee | 257/232 |
| 5,338,948 | 8/1994 | Sims | 257/249 |
| 5,418,387 | 5/1995 | Nakamura et al. | 257/231 |
| 5,517,043 | 5/1996 | Ma et al. | 257/229 |
| 5,600,159 | 2/1997 | Monoi et al. | 257/222 |
| 5,867,215 | 2/1999 | Kaplan | 348/315 |

FOREIGN PATENT DOCUMENTS

| | | | |
|---|---|---|---|
| 0 757 476 A2 | 2/1997 | European Pat. Off. | H04N 3/15 |
| 0 862 219 A2 | 9/1998 | European Pat. Off. | |
| 63-261744 | 10/1988 | Japan. | |

OTHER PUBLICATIONS

Eiji Oba, Imaging circuits and Systems/Paper 11.1–11.5, IEEE International Solid State Circuits Conf., pp. 180–189 and 452–454.

Hon–Sum Wong, Technology and Device Scaling Considerations for CMOS Imagers, IEEE vol. 43, No. 12, Dec. 1996.

Eric R. Fossum, Active Pixel Sensors: Are CCD's Dinosaurs?, SPIE vol. 1900.

Robert Guidash, U.S. Patent Application Ser. No. 08/808,444, Active Pixel Sensor With Inter–Pixel Sharing, filed Feb. 28, 1997.

128/128 CMOS Photodiode–type Active Pixel R.H. Nixon, S.E. Kemeny, C.O. Staller and E. R. Fossum, Sensor With on–Chip Timing, Control and Signal Chain Electronics, SPIE vol. 2415 (1995).

H. Kawashima, et al. "A ¼ Inch Format 250K Pixel Amplified MOS Image Sensor Using CMOS Process", *Proceeding of the International Electro Devices Meeting*, Washington, Dec. 5–8, 1993, pp. 575–578.

*Primary Examiner*—Ngân V. Ngô
*Attorney, Agent, or Firm*—James D. Leimbach

[57] ABSTRACT

An image sensor having a plurality of pixels arranged in a series of row and columns comprising: a semiconductor substrate having a plurality of pixels formed in rows and columns with at least two row adjacent pixels and at least two column adjacent pixels formed within the substrate; and at least one electrical function integrated within the adjacent pixels that is shared between the adjacent pixels. The electrical function can be either a contact region or an electrical circuit used in implementing either a photogate, a transfer gate, a reset gate, a row select gate, an amplifier drain, an output node, a floating diffusion contact, a reset drain, a lateral overflow gate, an overflow drain or an amplifier.

19 Claims, 6 Drawing Sheets

ACTIVE PIXEL IMAGE SENSOR WITH SHARED AMPLIFIER READ-OUT

CROSS-REFERENCE TO RELATED APPLICATIONS

The present application is related to U.S. application Ser. No. 08/808,444 filed Feb. 28, 1997 by Robert M. Guidash and entitled, "ACTIVE PIXEL SENSOR WITH INTER-PIXEL SHARING".

FIELD OF THE INVENTION

This invention relates to the field of solid state photosensors and imagers, and more specifically to semiconductor based imagers referred to as Active Pixel Sensors (APS).

BACKGROUND OF THE INVENTION

Active Pixel Sensors (APS) are solid state imagers wherein each pixel contains a photo-sensing means with associated active circuitry elements. These active circuitry elements typically are means to perform a pixel reset function, or some means to transfer charge, means to perform a voltage conversion, or circuitry elements used in amplification. APS devices have been operated in a manner where each line or row of the imager is selected and then read out using a column select signal (analogous to a word and bit line in memory devices respectively). Prior art devices have been disclosed in which all of these components have been located entirely within a single pixel boundary.

Inclusion of these active circuit element components in each pixel reduces the fill factor for the pixel because it takes up area that could otherwise be used for the photodetector. This reduces the sensitivity and saturation signal of the sensor which in turn adversely affects the photographic speed and dynamic range of the sensor, performance parameters that are critical to obtaining good image quality. Additionally, inclusion of these active circuit elements within the pixel places a limitation on the minimum size of the pixel, which adversely affects the size and cost of the image sensor.

In order to build high resolution, small pixel APS devices, it is necessary to use sub $\mu$m CMOS processes in order to minimize the area of the pixel allocated to the row select transistor and other parts of the amplifier in the pixel. In essence, it takes a more technologically advanced and more costly process to realize the same resolution and sensitivity APS device when compared to a standard charge coupled device (CCD) sensor. However, APS devices have the advantages of single 5V supply operation, lower power consumption, x-y addressability, image windowing and the ability to effectively integrate signal processing electronics on-chip, when compared to CCD sensors.

A typical prior art APS pixel is shown in FIG. 1. The pixel comprises a photodetector 14, that can be constructed from either a photodiode or photogate technology, a transfer gate 15, a floating diffusion 16, reset transistor 18 with a reset gate 19, a row select transistor 8 with a row select gate 9, and signal transistor 7 which is a source follower amplifier. Inclusion of all these components within a single pixel results in a reduction in the fill factor, sensitivity and minimum size of the pixel.

Referring to FIG. 2A in conjunction with FIG. 2B, one approach to providing an image sensor with the sensitivity of a CCD and the advantages of an APS device, is to improve the fill factor and sensitivity of an APS device by reducing the amount of area allotted to components within a single pixel while maintaining the desired features and functionality of the pixel architecture.

Referring to FIG. 2A in conjunction with FIG. 2B, U.S. patent application Ser. No. 08/808,444, entitled "Active Pixel Sensor With Inter-Pixel Function Sharing" by Guidash discloses a manner in which fill factors for APS devices can be increased. This prior art device of Guidash teaches the sharing of various components typically employed within an Active Pixel Sensor. Sharing of the floating diffusion, source follow amplifier, row select transistor, and reset transistor between two row adjacent photodetectors and transfer gates are disclosed here to assist in increasing the fill factor of the pixel architecture. The basic concept utilized by Guidash for increasing fill factor is the fact that a row at a time is read out during operation of the sensor. Accordingly, Guidash was able to provide a single floating diffusion 26 and a single amplifier 27 for pixels located in two adjacent rows, instead of requiring one for every pixel as in the APS device shown in FIG. 1. Since only one row is read out at a time, a single floating diffusion 26, reset transistor 28, row select transistor 29 and signal transistor 27 (typically a source follower transistor) can be used for two adjacent pixels in separate rows.

While allowing for the sharing of components and increasing the fill factors within active pixel sensors, the device shown in FIG. 2 does not allow for the combining of function between both rows and columns, and accordingly the increase in fill factor that would result from such an architecture.

It should be readily apparent from the foregoing discussion that there remains a need within the art for an APS architecture that will allow for the combining of electrical functions between row as well as column pixels and the resulting increase in fill factor.

SUMMARY OF THE INVENTION

This invention addresses the aforementioned problems within prior art Active Pixel Sensor (APS) devices. It comprises a pixel and column circuitry architecture innovation that provides a higher fill factor pixel or a smaller pixel. By sharing components between adjacent columns and adjacent rows, components can be shared by four (4) separate photodetectors and transfer gates instead of two (2). This invention provides a means to further improve fill factor and further diminish the minimum pixel size by sharing the aforementioned components additionally between two column adjacent photodetectors and transfer gates, so that these components are now shared by four separate photodetectors and transfer gates, while maintaining the ability to selectively address specific pixels of the APS device.

Briefly summarized, according to one aspect of the present invention is an image sensor having a plurality of pixels arranged in a series of rows and columns comprising: a semiconductor material of a first conductivity type having at least two adjacent row pixels and at least two adjacent column pixels formed within the substrate, and at least one electrical function integrated within the adjacent pixels that is shared between the adjacent pixels.

These and other aspects, objects, features, and advantages of the present invention will be more clearly understood and appreciated from a review of the following detailed description of the preferred embodiments and appended claims, and by reference to the accompanying drawings.

Advantageous Effect Of The Invention

The present invention has the following advantages:

High fill factor, sensitivity and saturation signal for the same pixel size.

Smaller pixel and device size for the same fill factor, providing a lower cost device.

BRIEF DESCRIPTION OF THE DRAWINGS

To facilitate understanding, identical reference numerals have been used, where possible, to designate identical elements that are common to the figures.

DETAILED DESCRIPTION OF THE INVENTION

I have discovered a pixel architecture wherein a smaller pixel size can be achieved by sharing functions between the adjacent pixels resulting in a smaller overall sensor device while still retaining as large a fill factor as larger sized sensor devices. This results in a lower cost device with a pixel size as large as existing prior art devices and having a higher fill factor with increased sensitivity and saturation signal is achieved.

Figure 1A:
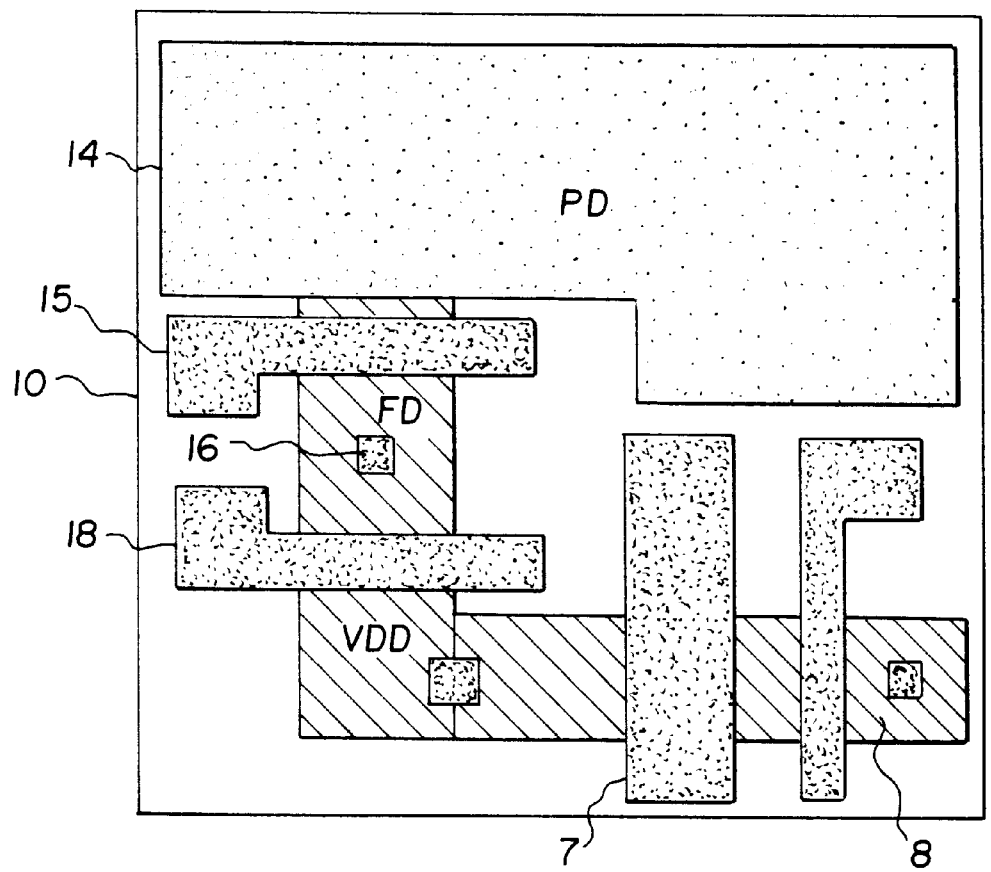
FIG. 1A is a top view of a prior art pixel.
Figure 1B:
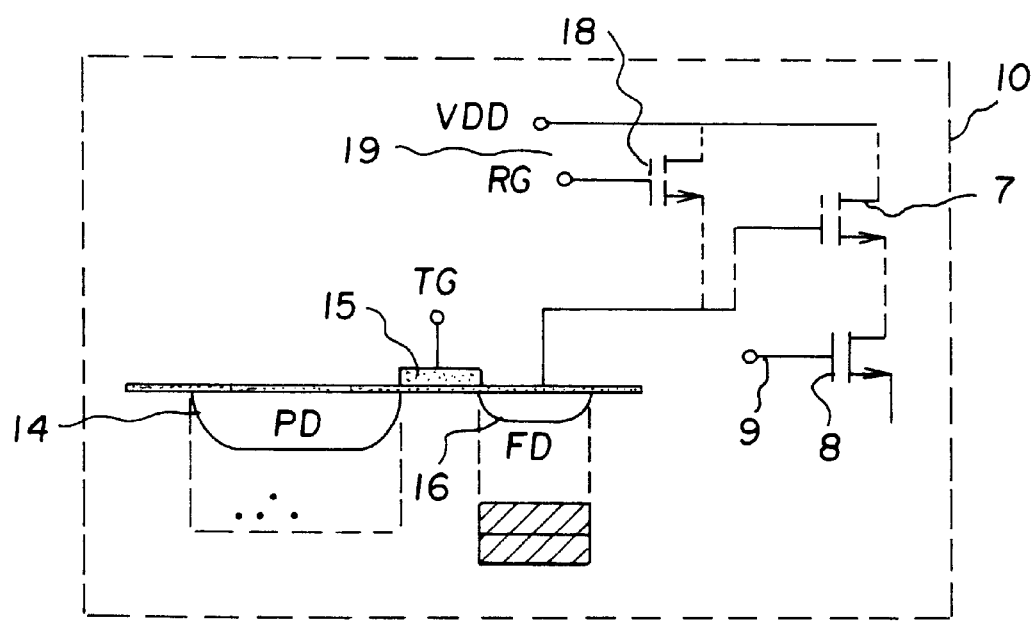
FIG. 1B is a schematic drawing of pixel shown in FIG. 1A.
Figure 2A:
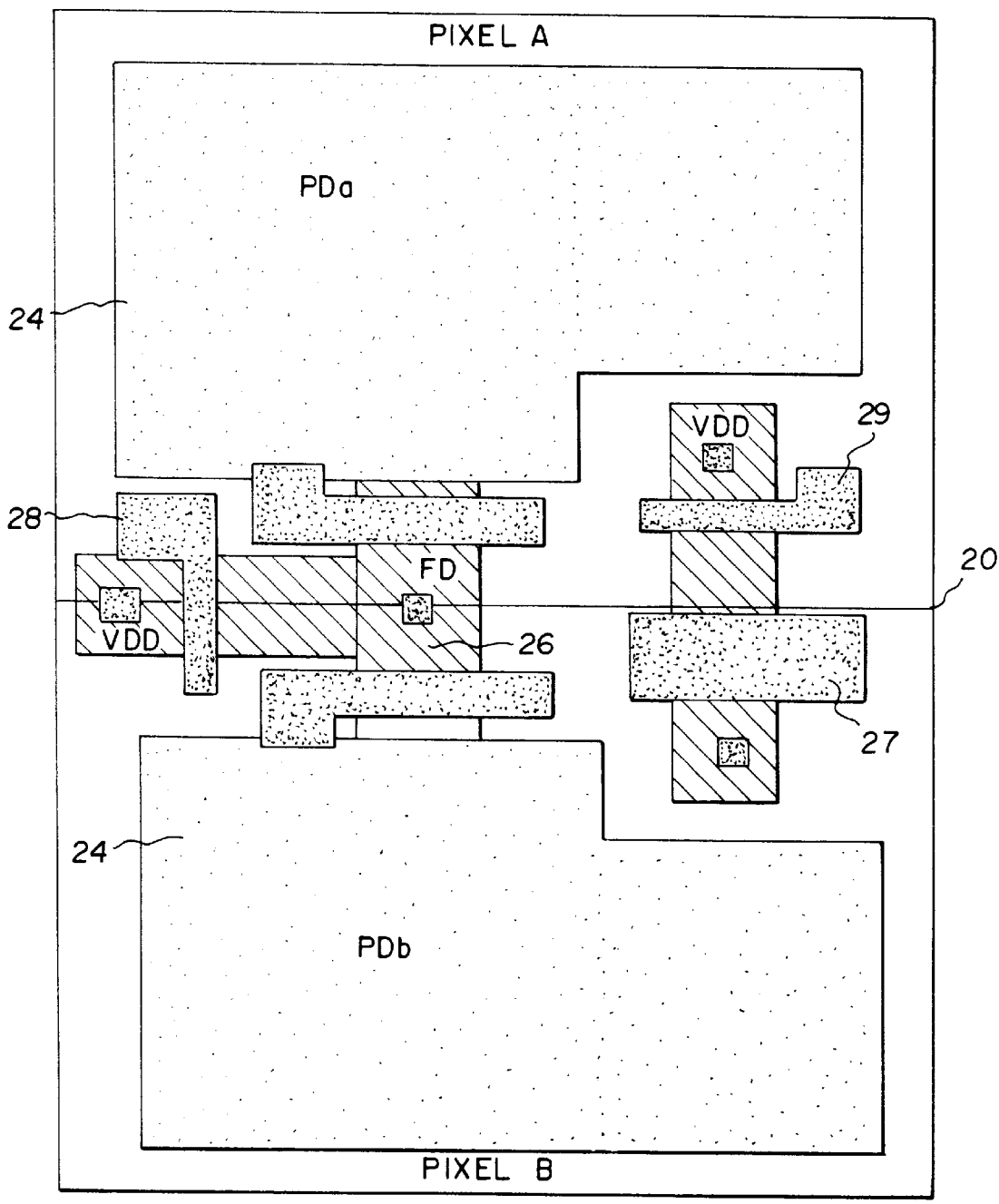
FIG. 2A is a top view of a prior art pixel with shared functionality.
Figure 2B:
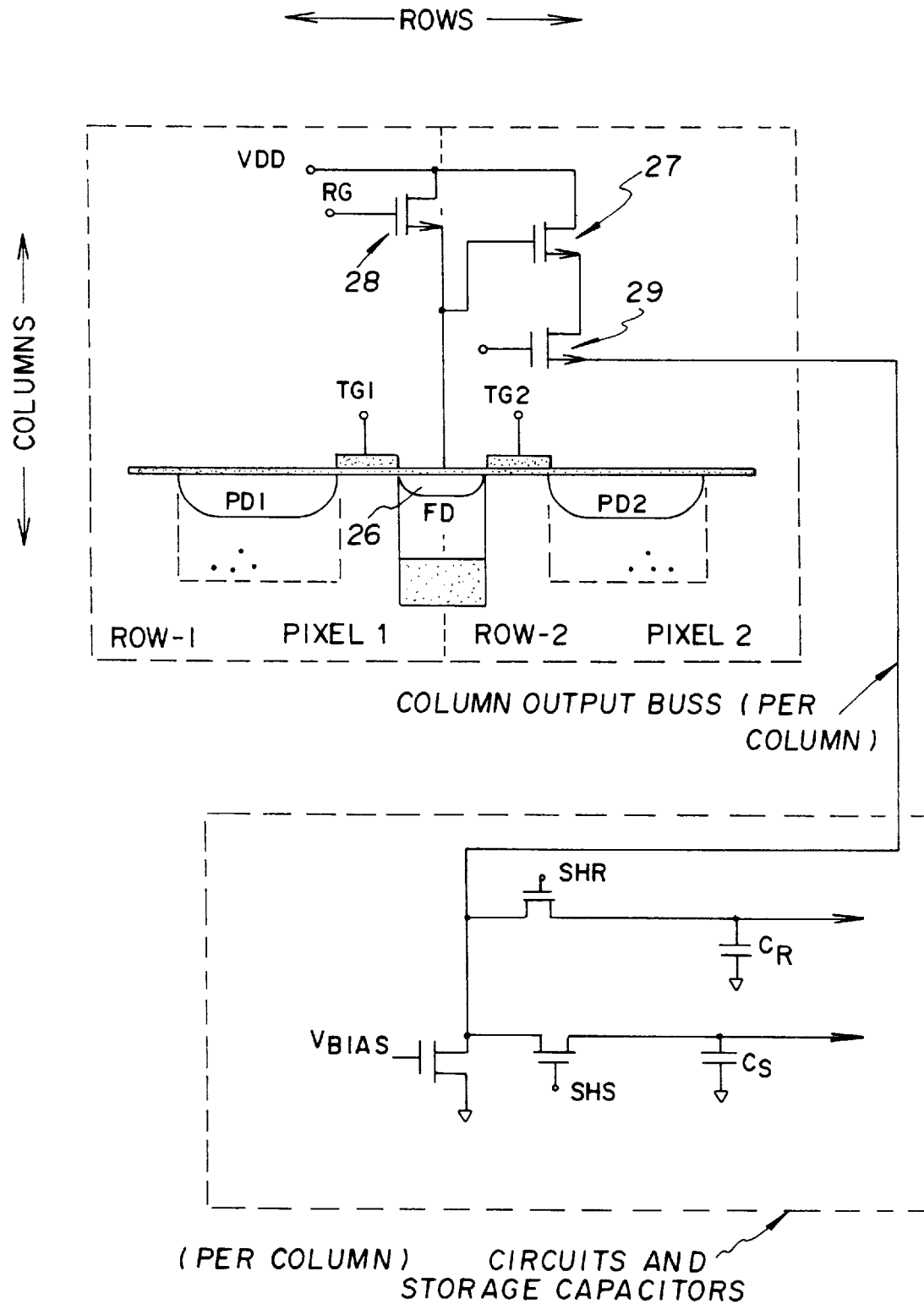
FIG. 2B is a schematic view of the prior art pixel with shared functionality shown in FIG. 2A.
Figure 3A:
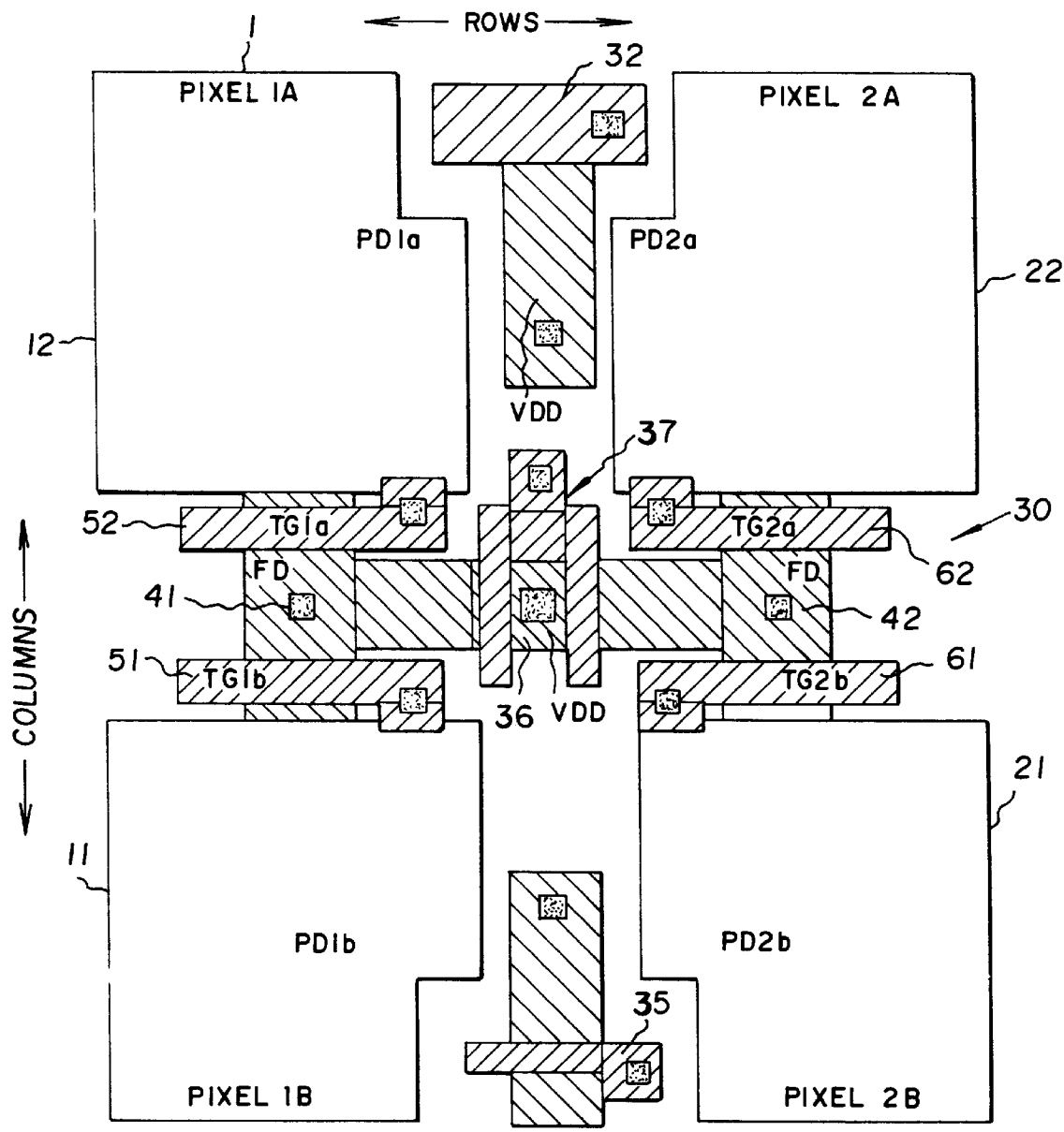
FIG. 3A is a top view of the pixel architecture with shared functionality as envisioned by the present invention.
Figure 3B:
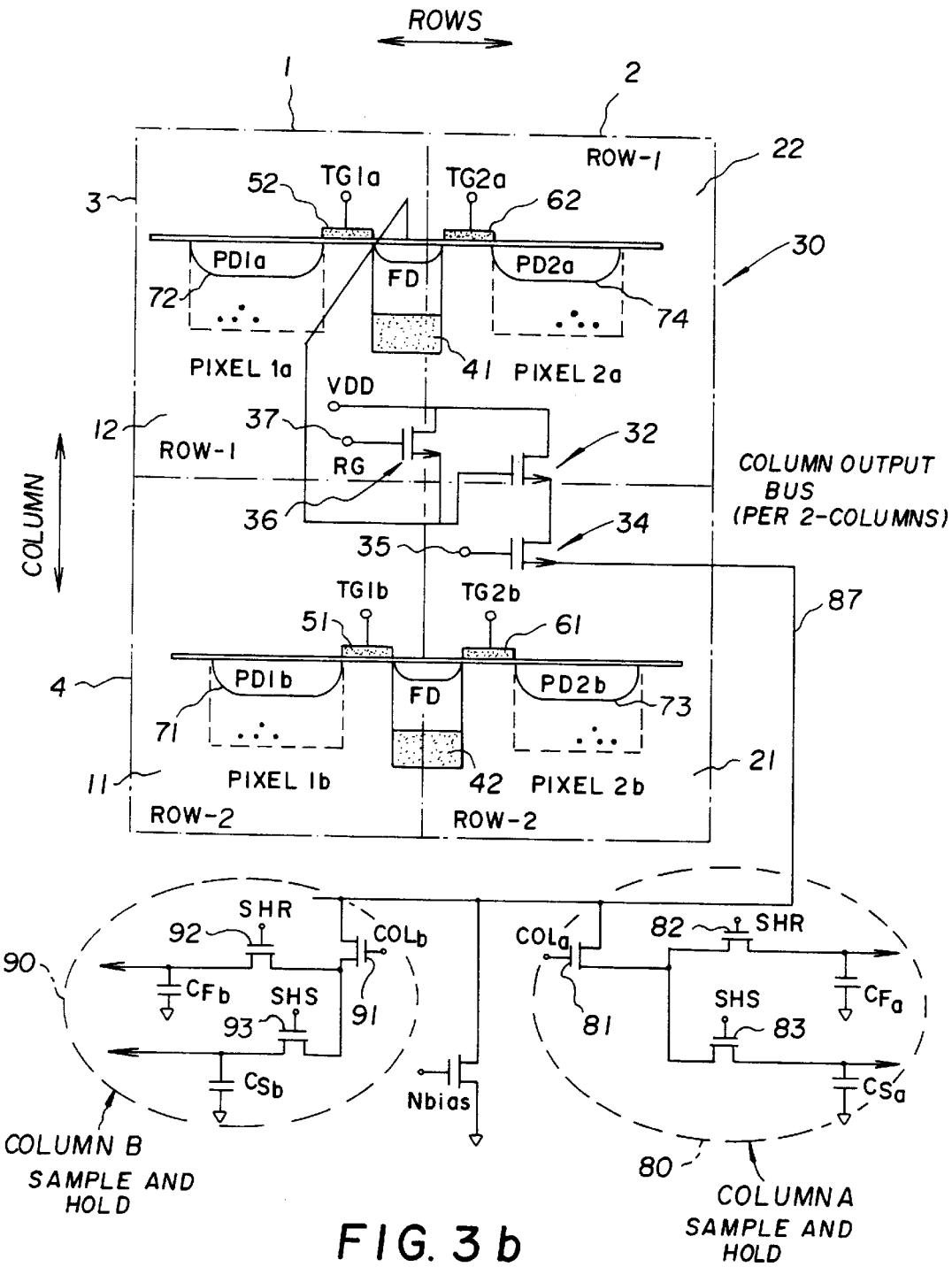
FIG. 3B is a schematic view of the pixel architecture shown in FIG. 3A.

Referring to FIG. 3a seen in conjunction with FIG. 3b, the preferred embodiment of the invention that represents one physical embodiment of the new pixel architecture can be appreciated. Other specific physical embodiments are realizable and should be readily apparent to those skilled in the art. This new architecture seen in FIG. 3a and FIG. 3b, generally referred to as 30, envisions sharing electrical functions between pixels 11, 12, 21, and 22 that are arranged as row adjacent pixels 11, 12 and 21, 22 and column adjacent column pixels 11, 21 and 12, 22. FIG. 3a illustrates a top view of pixel architecture 30 while FIG. 3b provides a schematic representation of the device shown in FIG. 3a. As can be seen, pixel architecture 30 provides a shared floating diffusion 41 between row adjacent pixels 11, 12 in row 1, and a shared floating diffusion 42 between row adjacent pixels 21, 22. Amplifier 32 is preferably a source follower transistor configuration that is shared between all four of the shared pixels 11, 12, 21, and 22, as is row select transistor 35, and reset transistor 36.

As shown in FIG. 3a and FIG. 3b, the row select signal bus 35 for both rows 1, 2 is the same, and the column output bus 87 for both columns a, b is actually the same. Image signal separation is achieved by having separate transfer gates 51, 52, 61 and 62 for each of the adjacent pixels 11, 12, 21, and 22. Separate transfer gate buses for every other pixel within a row, and a 1:2 column buss de-multiplexing scheme for each pair of columns.

Figure 4:
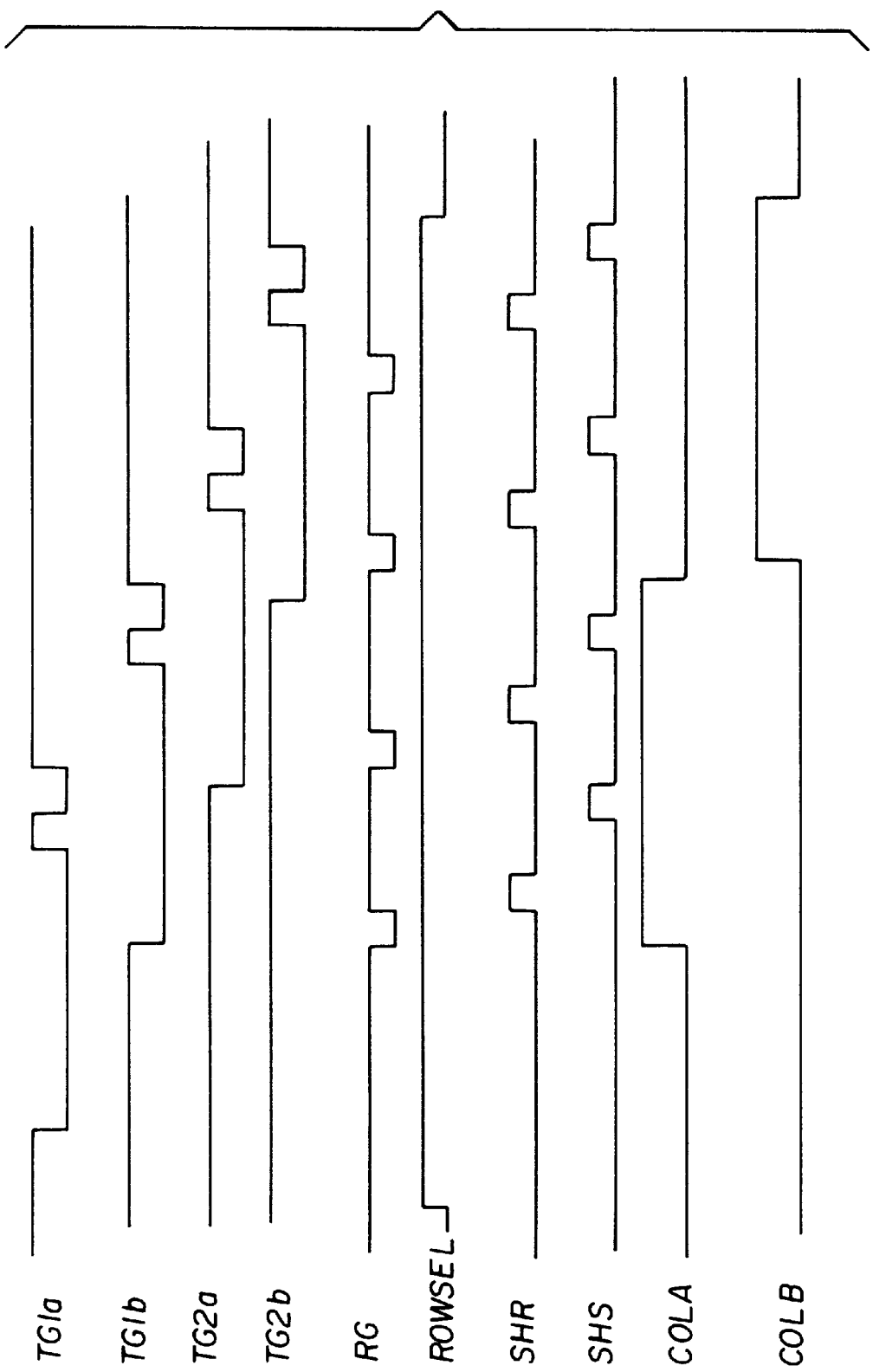
FIG. 4 is a timing diagram illustrating the operation of the present invention.

Referring now to FIG. 4 which is a timing diagram detailing one mode of operation of this new architecture in conjunction with FIG. 3a and FIG. 3b, The image sensor 30 is powered up in its reset state, with all the transfer gates 51, 52, 61 and 62 as well as the reset gate 37 turned on. Integration of row I begins by turning 52 off, which begins the integration for the odd pixels in row 1, which includes pixel 12. A predetermined time later transfer gate 51 is turned off, which begins the integration of the even pixels within row 1 which would include pixel 11 as illustrated. Once row 1 has integrated for the desired period of time row select gate 35, and the column. A transistor 81 is turned on, (column B transistor 91 is off). The reset level of the floating diffusion 41 is then read by turning reset gate 37 off and strobing SHR 82. Transfer gate 52 is then pulsed on and the signal charge from photodetector PD1a 72 is transferred onto the floating diffusion 41. The signal level is then read out for the odd row photodetectors in Row 1 by strobing SHS 83. While the integrated charge for pixel 12 was being transferred, pixel 11 was still allowing photodetector 71 to integrate. The transfer of the integrated charge within pixel 11, takes place when Column A transistor 81 is turned off and the Column B transistor 91 is turned on. Reset gate 37 is turned on again, resetting the floating diffusion 41. The reset level is then read out by strobing SHR. Next, transfer gate 51 is pulsed on at the appropriate time, which is determined to be that amount of time such that photodetectors 72 and 71 have the same integration time. The signal charge within photodetector PDB2 in pixel 11 is then transferred onto the floating diffusion 41 (this is the case for all of the even row photodetectors within Row 1). The signal level is then read by strobing SHS 93. Now all of the pixels in Row 1 have been read-out in to the bank of signal and reset capacitors. The line read-out is then done in the standard manner described in prior art CMOS imagers. This same sequence is then done for Row 2, where all of the signals are the same except transfer gate 62 and 61, and photodetectors 73, 74 for pixels 22 and 21, are used, respectively. This operation can be described conceptually as column interlaced, sample and hold, per row operation.

This architecture provides high fill factor and a resulting very small pixel size compared to prior art devices, since the active components are shared among four 4 photodetectors. One extra metal line per row is required, to provide all the required transfer gates, but this takes up much less area than that occupied by the active components in both the per pixel amplifier scheme and the per 2 pixel amplifier scheme, discussed previously. There are 3 extra timing and control signals required and 2 additional transistors per column required. However, these do not impact the pixel or image array area since they are incorporated in the CMOS logic outside of the image array. In addition to the temporal displacement of image capture on a per row basis, this architecture also has a temporal displacement of image capture of odd and even pixels within a given row. This time is very short however, (especially compared to the row to row temporal displacement), on the order of a few hundred nanoseconds, and will not produce any image capture artifacts. Because there is an extra sequence of sample and holds, (SHR and SHS strobes), the minimum line time is slightly longer for this new architecture, which will incrementally diminish the maximum frame rate for video applications.

The invention has been described in detail with particular reference to certain preferred embodiments thereof, but it will be understood that variations and modifications can be effected within the spirit and scope of the invention.

PARTS LIST 1 row 1
2 row 2
3 row 3
4 row 4
7 signal transistor
8 row select transistor
9 row select gate
10 prior art pixel
11 pixel
12 pixel
14 photodetector
15 transfer gate 16 floating diffusion
18 reset transistor
19 reset gate
21 pixel
22 pixel
24 photodetector
26 floating diffusion
27 signal transistor
28 reset transistor
29 select transistor
30 shared row and column circuit pixels
32 floating diffusion amplifier
34 row select transistor
35 row select gate
36 reset transistor
37 reset gate
38 column output bus
41 floating diffusion
42 floating diffusion
51 transfer gate
52 transfer gate
61 transfer gate
62 transfer gate
71 photodetector
72 photodetector
73 photodetector
74 photodetector
80 column sample hold
81 transistor
82 sample and hold reset
83 sample and hold signal
87 output bus
90 column sample hold
91 transistor
92 sample and hold reset
93 sample and hold signal

What is claimed is:

1. An image sensor having a plurality of pixels arranged in a series of rows and columns comprising:

a semiconductor material of a first conductivity type;

at least two row adjacent pixels and at least two column adjacent pixels formed within the substrate; and at least one shared contact region wherein the contact region is shared between the adjacent pixels and wherein the shared contact is selected from one of the following components (a photogate contact, a reset gate contact, a row select gate contact, an amplifier drain contact, an output node contact, a floating diffusion contact, a reset drain contact, a lateral overflow gate contact, or an amplifier contact).

2. The image sensor of claim 1 wherein the shared function further comprises a shared electrical component.

3. The image sensor of claim 1 wherein the shared function further comprises a shared contact region but not a shared electrical component between the adjacent pixels.

4. The image sensor of claim 1 wherein the shared function further comprises both a shared contact region and a shared electrical component.

5. The image sensor of claim 4 wherein the electrical component is selected from one of the following components (a reset transistor, a row select transistor, an amplifier drain, an output node, a floating diffusion, a lateral overflow gate, or an amplifier).

6. The image sensor of claim 1 further comprising a voltage supply of one pixel that is also used as an overflow drain for the adjacent pixel.

7. An image sensor having a plurality of pixels arranged in rows and columns comprising:

a row select signal that is operative to concurrently select two row adjacent pixels and a row select bus that is operative for the two row adjacent pixels;

a column output bus operative for two column adjacent pixels;

a separate transfer gate for each of the pixels; and a separate transfer gate bus for every other pixel within a given row.

8. The image sensor of claim 7 further comprising a 1:2 column bus de-multiplexing scheme for each pair of columns.

9. The image sensor of claim 7 further comprising a contact region formed on an electrical component that is shared by the adjacent pixels.

10. The image sensor of claim 7 further comprising a contact region formed on each of the adjacent pixels for operation of an electrical component that is shared.

11. An image sensor having a plurality of pixels arranged in rows and columns arranged on a semiconductor substrate comprising:

at least two row adjacent pixels and at least two column adjacent pixels each having a photodetector formed within the substrate;

transfer gate provided for each pixel, the transfer gate being connected to a sense node.

12. The image sensor of claim 11 further comprising a shared contact region that is shared by at least two of the adjacent pixels.

13. The image sensor of claim 11 further comprising a shared electrical component that is shared between at least two of the adjacent pixels and wherein the shared component is selected from one of the following components (a reset gate, a row select gate, an amplifier drain, an output node, a floating diffusion, a reset drain, a lateral overflow gate, an overflow drain or an amplifier).

14. The image sensor of claim 13 wherein the electrical component is constructed with at least a portion of the electrical component formed along a common border of the adjacent pixels that share the electrical component.

15. The image sensor of claim 11 further comprising a voltage source of one of the adjacent pixels is also used as an overflow drain for another of the adjacent pixels.

16. An image sensor having a plurality of pixels arranged in a series of rows and columns comprising:

a semiconductor material of a first conductivity type;

at least two row adjacent pixels and at least two column adjacent pixels formed within the substrate; and at least one electrical component that is shared between the adjacent pixels wherein the electrical component is selected from one of the following components (a reset transistor, a row select transistor, an amplifier drain, an output node, a floating diffusion, a lateral overflow gate, or an amplifier).

17. The image sensor of claim 15 further comprising a column output bus operative for two column adjacent pixels.

18. The image sensor of claim 17 further comprising a 1:2 column bus de-multiplexing scheme for each pair of columns.

19. The image sensor of claim 15 further comprising a shared contact region.

* * * * *

UNITED STATES PATENT AND TRADEMARK OFFICE
CERTIFICATE OF CORRECTION

PATENT NO.   : 6,107,655                                                Page 1 of 1
DATED        : August 22, 2000
INVENTOR(S)  : Robert M. Guidash It is certified that error appears in the above-identified patent and that said Letters Patent is hereby corrected as shown below:

<u>Column 6,</u>
Lines 58 and 60, delete "Claim 15" and replace with -- Claim 16 --.

Signed and Sealed this

Second Day of May, 2006

JON W. DUDAS
*Director of the United States Patent and Trademark Office*